United States Patent [19]
Martinez

[11] Patent Number: 4,785,201
[45] Date of Patent: Nov. 15, 1988

[54] HIGH SPEED/HIGH DRIVE CMOS OUTPUT BUFFER WITH INDUCTIVE BOUNCE SUPPRESSION

[75] Inventor: Marcelo A. Martinez, Fremont, Calif.

[73] Assignee: Integrated Device Technology, Inc., Santa Clara, Calif.

[21] Appl. No.: 947,430

[22] Filed: Dec. 29, 1986

[51] Int. Cl.⁴ .................................. H03K 19/003
[52] U.S. Cl. ................... 307/443; 307/451; 307/585; 307/263
[58] Field of Search ............ 307/200 B, 443, 448, 307/451, 452–453, 577, 579, 584–585, 263

[56] References Cited

U.S. PATENT DOCUMENTS

| | | | |
|---|---|---|---|
| 3,846,822 | 11/1974 | Riley et al. | 357/23.4 |
| 4,567,378 | 1/1986 | Raver | 307/443 X |
| 4,587,445 | 5/1986 | Kanuma | 307/443 |
| 4,609,834 | 9/1986 | Gal | 307/443 |
| 4,622,482 | 11/1986 | Ganger | 307/585 |
| 4,638,187 | 1/1987 | Boler et al. | 307/579 X |

Primary Examiner—Stanley D. Miller
Assistant Examiner—D. R. Hudspeth
Attorney, Agent, or Firm—Thomas E. Schatzel

[57] ABSTRACT

An output buffer is disclosed which employs a first pair of transistors connected in an (N-channel over P-channel) totem pole configuration, a second pair of transistors connected in a (P-channel over N-channel) totem pole configuration in parallel with the first pair of transistors, and a pair of inverters connected to delay the drive to the second pair of transistors.

8 Claims, 2 Drawing Sheets

FIG._1 (PRIOR ART)

HIGH SPEED/HIGH DRIVE CMOS OUTPUT BUFFER WITH INDUCTIVE BOUNCE SUPPRESSION

BACKGROUND OF THE INVENTION

1. Field of the Invention

The present invention relates to integrated circuit devices generally and more particularly to an output buffer having improved transient suppression.

2. Description of the Prior Art

A transient (spike or bounce) problem has been associated with certain high speed, high drive, CMOS, integrated circuit type output buffers. More specifically, when the state of an output buffer is switched, transients are developed across stray inductances in the buffer ground and power ($V_{cc}$) paths. These transients are coupled to the outputs of other output buffers which share the same ground and power paths.

For example, consider the pair of prior art type output buffers illustrated in FIG. 1 of the drawing generally designated by the numbers 10 (on the left side of the drawing) and 10' (on the right), respectively. Buffer 10 is shown to employ a P-channel, field effect transistor (FET), which is designated 12 (in the center of the drawing), and an N-channel, field effect transistor, designated 14. Transistors 12 and 14 are connected in what is referred to herein as a (P-channel over N-channel) totem pole configuration. More specifically, the gate of transistor 12 is coupled by a line 20 and a pair of inverters 22 and 24 to the output of a 2-input NAND gate 26. The inputs of gate 26 are connected, one to a line 28 to receive a buffer 10 enabling signal and the other to a line 30 to receive a data input signal. The source of transistors 12 is connected to a line 40; and, the drain of the transistor (12) is connected to a line 50, upon which buffer 10 develops a data output signal.

The gate of transistor 14 is coupled by a line 60 and another inverter 62 to the output of another 2-input NAND gate 64. One of the inputs of gate 64 is coupled by still another inverter 66 to line 30; and, the other input of the gate is connected to line 28. The drain of transistor 14 is connected to a line 50; and, the source of the transistor is connected to a line 70.

Output buffer 10' is similar to output buffer 10. (For clarity, in the drawing, corresponding parts are similarly numbered, the buffer 10' part numbers additionally having a prime.)

The sources of transistors 12 and 12' are directly connected to receive a power supply potential ($V_{cc}$); and, the sources of transistors 14 and 14' are directly connected to receive a circuit ground potential. However, there are stray inductances associated with the connections, attributable, in part, to the chip metalization, to the wire bonding, and to the lead frame. (The stray inductances pose a particular problem with devices which are of the series that is commonly designated 7400 and which are packaged in dual in-line packages (DIPs) in which the ground and power pins are located at the extreme ends of the package.)

For purposes of illustration, the stray inductances are represented by discrete inductors. Thus, in the drawing, line 40 is shown coupled by an inductor 80 (representing the stray inductances in the power path) to a line 82 to receive the power supply potential; and, line 70 is shown coupled by an inductor 84 (representing the stray inductances in the ground path) to a line 86 to receive the circuit ground potential.

The capacitive reactance of the output buffer 10 load is represented in the drawing by a discrete capacitor 90 connected between lines 50 and 86.

First, assume that output buffer 10 is in the state in which transistor 12 is "on" and transistor 14 is "off". In this state, a "high" logic level potential is developed on line 50 and across capacitor 90. Also, assume that output buffer 10' is in the state in which transistor 12' is "off" and transistor 14' is "on" developing a "low" logic level potential on line 50'.

Next, assume that the state of output buffer 10 is switched so as to turn transistor 12 "off" and transistor 14 "on". When transistor 14 is turned "on", the potential developed across capacitor 90 is coupled by transistor 14 across inductor 84. As a consequence, a transient is developed across inductor 84. Since transistor 14' (of output buffer 10') is "on", the transient is coupled by transistor 14' to line 50'. (A similar transient is developed on line 50' when output buffer 10' is held in the state in which transistor 12' is "on" and transistor 14' is "off" while the state of output buffer 10 is switched so as turn transistor 14 "off" and transistor 12 "on".)

The transient problem is primarily associated with high speed, high drive, CMOS, integrated circuit type output devices. With those devices of the 7400 series that are designated 74XXX, 74HXXX, 74SXXX, and 74LSXXX, the transient turns "off" the bipolar transistor equivalent of (FET) transistor 14' before the (bipolar) transistor couples an appreciable amount of the transient to the output of the output buffer. Also, with those devices of the 7400 series that are designated 74HCXXX and 74HCTXXX, the equivalent of transistors 12 and 14 and their drivers are not strong enough to develop an appreciable transient level across the equivalent of inductors 80 and 84. However, as the transistor channel length is decreased (to less than two micron (one millionth of a meter) and the transistor channel width is increased, a transient of appreciable level is developed across the equivalent of inductor 84 and coupled to the equivalent of line 50'. A transient having a rise time of less than one nanosecond and a level in excess of three volts has been observed across the equivalent of inductor 84 when seven of eight output buffers (of an octal buffer) are simultaneously switched.

For a additional information on the transient problem, the reader is directed to the articles which appeared on pages 29 and 30 of the Aug. 7, 1986 issue and on pages 81 and 82 of the Sept. 18, 1986 issue of *Electronics*.

SUMMARY OF THE PRESENT INVENTION

It is therefore the primary object of the present invention to provide a high speed, high drive, CMOS, integrated circuit type output buffer having improved transient suppression.

Another object of the present invention is to provide a transient suppressed, high speed, high drive, CMOS, integrated circuit type output buffer compatible with the 7400 series devices (that are packaged in dual in-line packages in which the ground and power pins are located at the extreme ends of the package).

Another object of the present invention is to provide a simple, transient suppressed, high speed, high drive, CMOS, integrated circuit type output buffer.

Briefly, the presently preferred embodiment of the present invention employs a first pair of transistors connected in an (N-channel over P-channel) totem pole configuration, a second pair of transistors connected in a (P-channel over N-channel) totem pole configuration in parallel with the first pair of transistors, and a pair of inverters connected to delay the drive to the second pair of transistors.

The ability to provide a high speed, high drive, CMOS, integrated circuit type output buffer having improved transient suppression is the principal advantage of the present invention.

Another advantage of the present invention is the ability it affords to provide a transient suppressed, high speed, high drive, CMOS, integrated circuit type output buffer compatible with the 7400 series devices (that are packaged in dual in-line packages in which the ground and power pins are located at the extreme ends of the package).

Another advantage of the present invention is the ability it affords to provide a simple, transient suppressed, high speed, high drive, CMOS, integrated circuit type output buffer.

These and other objects and advantages of the present invention will no doubt be obvious to those skilled in the art after having read the following detailed description of the presently preferred embodiment which is illustrated in a figure of the drawing.

IN THE DRAWING

DETAILED DESCRIPTION OF THE PREFERRED EMBODIMENT

Figure 2:
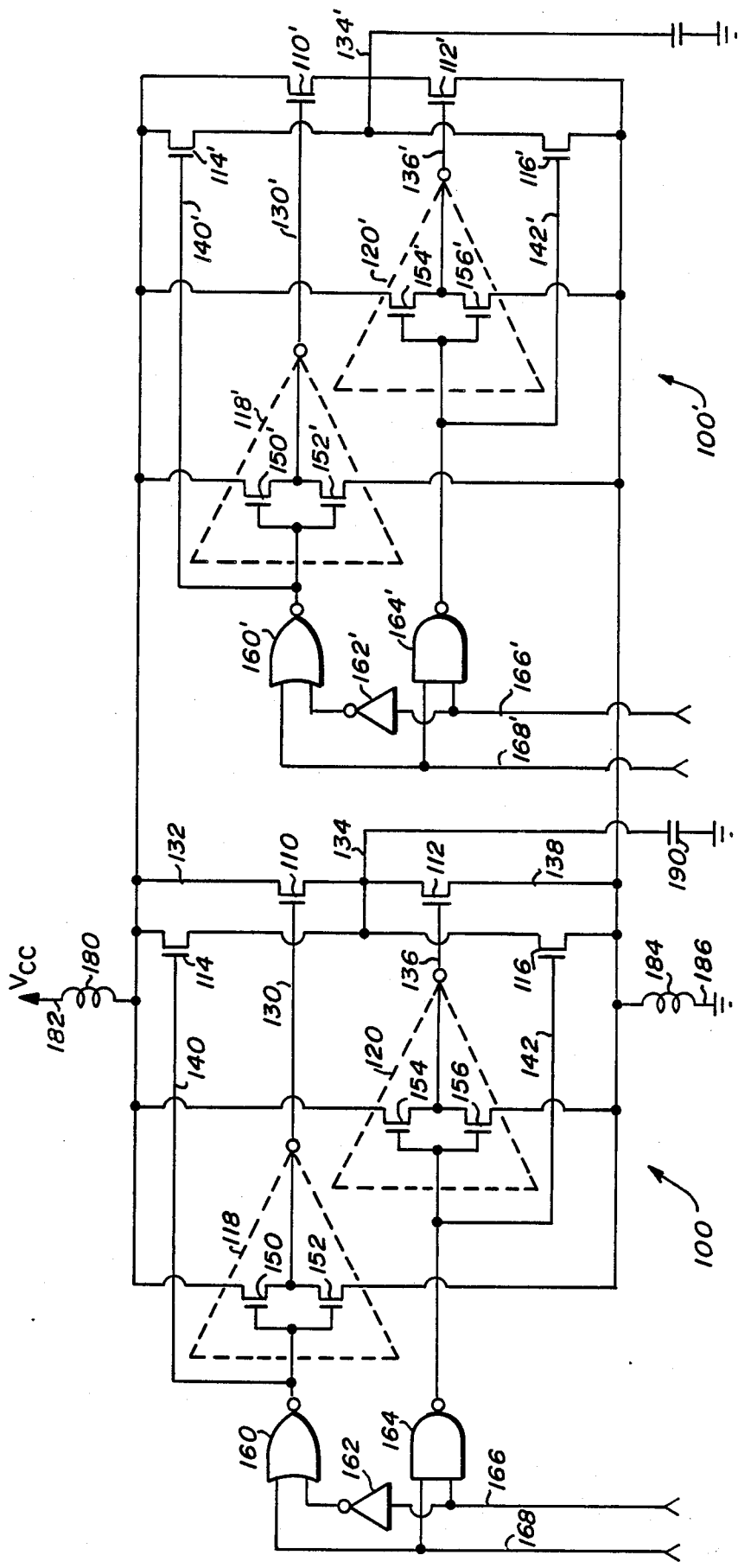
FIG. 2 is a schematic diagram of a pair of output buffers each in accordance with the presently preferred embodiment of the present invention.

Illustrated in FIG. 2 of the drawing generally designated by the numbers 100 (on the left of the drawing) and 100' (on the right), respectively, are a pair of output buffers each in accordance with the presently preferred embodiment of the present invention. Output buffer 100 is shown to employ as principal components (from the center of the drawing to the left) a first pair of field effect transistors (FETs), including a P-channel transistor 110 and an N-channel transistor 112; a second pair of transistors (FETs), including an N-channel transistor 114 and a P-channel transistor 116; and a pair of inverters, respectively designated 118 and 120. Transistors 110 and 112 are connected in the (P-channel over N-channel) totem pole configuration. More specifically, the gate of transistor 110 is connected by a line 130 to the output of inverter 118. (One end of the channel, which is referred to herein as) the source of transistor 110, is connected to a line 132; and, (the other end of the channel, which is referred to herein as) the drain of the transistor (110), is connected to a line 134, upon which buffer 100 develops a data output signal. The gate of transistor 112 is connected by a line 136 to the output of inverter 120. The drain of transistor 112 is connected to line 134; and, the source of the transistor is connected to a line 138.

Transistors 114 and 116 are connected in what is referred to herein as an (N-channel over P-channel) totem pole configuration. More specifically, the gate of transistor 114 is connected by a line 140 to the input of inverter 118. The drain of transistor 114 is connected to line 132; and, the source of the transistor is connected to line 134. The gate of transistor 116 is connected by a line 142 to the input of inverter 120. The source of transistor 116 is connected to line 134; and, the drain of the transistor is connected to a line 138.

Inverter 118 includes a P-channel transistor (FET) 150 and an N-channel transistor (FET) 152. Transistors 150 and 152 are connected in the (P-channel over N-channel) totem pole configuration, the transistor gates being connected to line 140. Similarly, inverter 120 includes a P-channel transistor (FET) 154 and an N-channel transistor (FET) 156, that are also connected in the (P-channel over N-channel) totem pole configuration.

Additionally, output buffer 100 employs a 2-input NOR gate 160, an inverter 162, and a 2-input AND gate 164. Gate 160 is configured with the gate output connected to line 140, with one of the gate inputs coupled by inverter 162 to a line 166 to receive a buffer 100 enabling signal, and with the other gate input connected to a line 168 to receive a data input signal. Gate 164 is configured with the gate output connected to line 142, with one of the gate inputs connected to line 168, and with the other gate input connected to line 166.

Output buffer 100' is similar to output buffer 100. (For clarity, in the drawing, corresponding parts are similarly numbered, the buffer 100' part numbers additionally having a prime.)

The sources of transistors 110, 154, and 150 and the drain of transistor 114 are directly connected to receive a power supply potential ($V_{cc}$); and, the sources of transistors 112, 156, and 152 and the drain of transistor 116 are directly connected to receive a circuit ground potential. For purposes of illustration, the stray inductances associated with the connections are represented by discrete inductors. Thus, in the drawing, line 132 is shown coupled by an inductor 180 (representing the stray inductances in the power path) to a line 182 to receive the power supply potential; and, line 138 is shown coupled by an inductor 184 (representing the stray inductances in the ground path) to a line 186 to receive the circuit ground potential.

The capacitive reactance of the output buffer 100 load is represented in the drawing by a discrete capacitor 190 connected between lines 134 and 186.

In the presently preferred embodiment, the transistors have the following parameters:

| Transistor | Type | $V_{TH}$ | Channel Width | Channel Length |
|---|---|---|---|---|
| 110 | P-Channel | −0.8 V | 260 Microns | 1.6 Microns |
| 112 | N-channel | +0.8 V | 1400 Microns | 1.6 Microns |
| 114 | N-Channel | +0.8 V | 300 Microns | 1.4 Microns |
| 116 | P-Channel | −0.8 V | 500 Microns | 1.4 Microns |
| 150 | P-channel | −0.8 V | 120 Microns | 1.0 Microns |
| 152 | N-Channel | +0.8 V | 15 Microns | 1.0 Microns |
| 154 | P-channel | −0.8 V | 20 Microns | 1.0 Microns |
| 156 | N-Channel | +0.8 V | 120 Microns | 1.0 Microns |

Where $V_{TH}$ is the threshold voltage. $T_{OX}$, the oxide thickness, is 250 Angstroms; and, $X_j$, the depth, is 0.25 microns. The gate overlap of the drain/source is 0.1 microns. The transistors of gates 160 and 164 have a width/length of 60 microns/1.0 microns; and, the transistors of inverter 162 have a width/length of 30 microns/1.0 microns.

Figure 1:
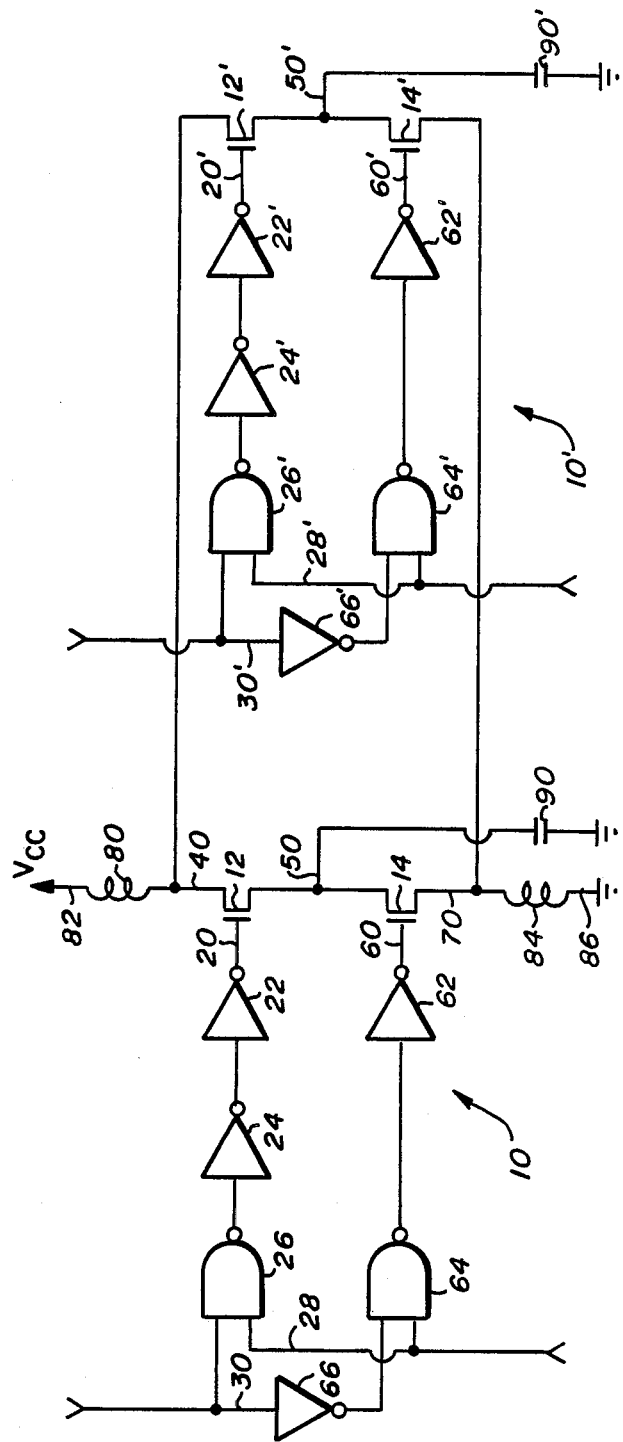
FIG. 1 is a schematic diagram of a pair of prior art type output buffers.

In understanding the operation of output buffer 100, first, assume that output buffer 100 is in the state in which transistors 110 and 114 are "on" and transistors 112 and 116 are "off". In this state, a "high" logic level potential is developed on line 134 and across capacitor 190. Next, assume that the state of output buffer 100 is switched so as to turn transistors 110 and 114 "off" and transistors 112 and 116 "on". Transistor 116 is turned "on" before transistor 112. As transistor 116 is turned "on", the transient developed across inductor 184 limits the speed at which the transistor can be turned "on". (The transient tends to turn transistor 116 "off".) Inverter 120 functions as a means for delaying the drive to transistor 112, delaying the time at which the transistor turns "on". As a consequence, the level of the transient developed across inductor 184 is controlled (in part, by the geometry of transistors 154 and 116), while providing high output drive capability (controlled by the geometry of transistor 112). (Transistor 116 is turned "on" earlier than transistor 14 (shown in prior art FIG. 1), partially compensating for the delay in turning "on" transistor 112. Additionally, speed can be traded for amplitude of the transient by changing the geometry of transistor 154, a wider channel providing higher speed at the expense of higher transient amplitude and vice versa.)

It is contemplated that after having read the preceeding disclosure, certain alterations and modifications of the present invention will no doubt become apparent to those skilled in the art. It is therefore intended that the following claims be interpreted to cover all such alterations and modifications as fall within the true spirit and scope of the invention.

What is claimed is:

1. An output buffer comprising in combination:
   a line for connection to receive an externally developed power supply potential;
   a line upon which the output buffer develops a data output signal;
   coupling means for coupling said power supply potential line to said data output signal line;
   a line for connection to receive an externally developed circuit ground potential;
   a line for connection to receive an externally developed first data input signal;
   first delay means including a data input connected to said first data input signal line and a data output;
   an N-channel transistor including a gate connected to said first delay means data output, drain means connected to said data output signal line, and source means connected to said circuit ground potential line; and
   a P-channel transistor including a gate connected to said first delay means data input, source means connected to said data output signal line, and drain means connected to said circuit ground potential line.

2. An output buffer as recited in claim 1 wherein said first transistor has a channel length which is less than two microns.

3. An output buffer as recited in claim 1 wherein said first delay means includes a pair of transistors connected in a totem pole configuration.

4. An output buffer as recited in claim 1 wherein said coupling means includes a line for connection to receive an externally developed second data input signal and a third transistor having a gate connected to said second data input signal line, drain means connected to said power supply potential line, and source means connected to said data output signal line.

5. An output buffer as recited in claim 4 wherein said coupling means further includes second delay means including a data input connected to said second data input signal line and a data output and a fourth transistor having a gate connected to said second delay means data output, source means connected to said power supply potential line, and drain means connected to said data output signal line.

6. An output buffer as recited in claim 5 wherein said third transistor is an N-channel transistor and wherein said fourth transistor is a P-channel transistor.

7. An output buffer as recited in claim 5 wherein said second delay means includes a pair of transistors connected in a totem pole configuration.

8. An output buffer as recited in claim 5 wherein said power supply potential line and said circuit ground potential line are shared with another output buffer.

* * * * *